United States Patent
Wang et al.

(10) Patent No.: US 10,700,281 B2
(45) Date of Patent: Jun. 30, 2020

(54) SEMICONDUCTOR RANDOM ACCESS MEMORY AND MANUFACTURING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Changzhou Wang, Shanghai (CN); Jiquan Liu, Shanghai (CN)

(73) Assignees: Semiconductor Manufacturing (Shanghai) International Corporation, Shanghai (CN); Semiconductor Manufacturing (Beijing) International Corporation, Beijing (CN)

( * ) Notice: Subject to any disclaimer, the term of this patent is extended or adjusted under 35 U.S.C. 154(b) by 0 days.

(21) Appl. No.: 15/812,445

(22) Filed: Nov. 14, 2017

(65) Prior Publication Data

US 2018/0151801 A1    May 31, 2018

(30) Foreign Application Priority Data

Nov. 30, 2016    (CN) .......................... 2016 1 1074755

(51) Int. Cl.
*H01L 45/00*    (2006.01)
*C23C 16/06*    (2006.01)
*C23C 16/34*    (2006.01)

(52) U.S. Cl.
CPC .......... *H01L 45/1683* (2013.01); *C23C 16/06* (2013.01); *C23C 16/34* (2013.01);
(Continued)

(58) Field of Classification Search
CPC ..... H01L 45/1683; H01L 45/16; H01L 45/04; H01L 45/1253; H01L 45/10; H01L 45/1233; C23C 16/06; C23C 16/34
See application file for complete search history.

(56) References Cited

U.S. PATENT DOCUMENTS 7,319,270 B2 * 1/2008 Lian .................. H01L 27/10852
257/207
10,090,465 B2 * 10/2018 Hsu ...................... H01L 45/1675
(Continued)

OTHER PUBLICATIONS

Bishop, Charles A. "Chapter 19", Atomic Layer Deposition, 2011, pp. 331-336, Vacuum Deposition onto Webs, Films and Foils (Year: 2011).*

*Primary Examiner* — Kyoung Lee
*Assistant Examiner* — Christina A Sylvia
(74) *Attorney, Agent, or Firm* — Brinks Gilson & Lione (57) ABSTRACT

The present disclosure discloses a resistive random access memory (RRAM) and a method for manufacture the RRAM. The method includes: providing a bottom interconnection layer; forming a bottom dielectric layer above the bottom interconnection layer, the bottom dielectric layer comprising a via through the bottom dielectric layer that exposes a portion of the bottom interconnection layer; and forming a bottom electrode layer in the via, the bottom electrode layer including a first electrode selectively grown above the bottom interconnection layer. The bottom electrode layer manufactured in such a way provides improved filling capability of the bottom electrode layer in the via.

9 Claims, 6 Drawing Sheets

(52) U.S. Cl.
CPC .............. *H01L 45/04* (2013.01); *H01L 45/06* (2013.01); *H01L 45/10* (2013.01); *H01L 45/1233* (2013.01); *H01L 45/1253* (2013.01); *H01L 45/16* (2013.01)

(56) References Cited

U.S. PATENT DOCUMENTS

| | | | | |
|---|---|---|---|---|
| 2005/0032365 | A1* | 2/2005 | Marsh | C23C 16/18 438/681 |
| 2007/0012905 | A1* | 1/2007 | Huang | H01L 45/06 257/2 |
| 2008/0062740 | A1* | 3/2008 | Baek | G11C 13/0007 365/148 |
| 2010/0200831 | A1* | 8/2010 | Jeon | H01L 45/04 257/4 |
| 2013/0089949 | A1* | 4/2013 | Phatak | H01L 45/1616 438/104 |
| 2013/0336041 | A1* | 12/2013 | Tsai | G11C 13/0002 365/148 |
| 2015/0144859 | A1* | 5/2015 | Chen | H01L 45/146 257/4 |
| 2015/0295172 | A1* | 10/2015 | Sung | H01L 45/1253 257/2 |
| 2016/0013107 | A1* | 1/2016 | Won | H01L 21/28088 438/592 |
| 2016/0248002 | A1* | 8/2016 | Lu | H01L 43/02 |

* cited by examiner

FIG. 14

SEMICONDUCTOR RANDOM ACCESS MEMORY AND MANUFACTURING METHOD THEREOF

CROSS REFERENCE TO RELATED APPLICATIONS

The present application is based on and claims priority to Chinese Patent Application CN201611074755.1, filed Nov. 30, 2016, the entire content of which is incorporated herein by reference.

BACKGROUND

Technical Field

The present disclosure relates to the field of semiconductor technologies, and in particular, to a Resistive Random Access Memory (RRAM) and a manufacturing method thereof.

Related Art

Among various types of Non-Volatile Memory (NVM), the RRAM has increasingly attracted attention, and such a memory has provided many advantages, including structural simplicity, low power consumption, fast operation, high level of integration, and so on. Selection of a suitable electrode is key to the manufacturing and operation of an RRAM device.

A bottom electrode (BE) of a RRAM unit may be processed in a Back End Of Line (BEOL) stage. It is preferable that the BE material possesses sufficient gap filling capability. A TiN film formed through a Physical Vapor Deposition (PVD) process provides an electrode most researched and commonly used for BE in a RRAM device because the TiN film has excellent electric performance. However, the TiN film formed through PVD process has a poor gap filling capability. In order to improve the gap filling capability of TiN, a deposition process using a higher voltage DC power source and AC bias power source is required. TiN film deposited in such a way may possess an improved gap filling capability. It is, however, subject to peeling. That is, such a TiN film is easy to peel off from a chip. A current research result shows that a bottom electrode TiN film has a relatively high compressive stress of about −3000 to −7000 MPa. The peeling issues occur in a later TiN deposition process and become worse with extension of the time, and are more serious at edges of the chip. Therefore, it is necessary to balance the tradeoff between gap filling capability and the peeling issues.

SUMMARY

The inventor of the present disclosure finds that problems exist in the prior art, and thus proposes a new technical solution for at least one of the problems.

According to a first aspect of the present disclosure, a method for manufacturing a RRAM is provided, including: providing a bottom interconnection layer; forming a bottom dielectric layer above the bottom interconnection layer, the bottom dielectric layer comprising a via though the bottom dielectric layer that exposes a portion of the bottom interconnection layer; and forming a bottom electrode layer in the via, the bottom electrode layer including a first electrode selectively grown above the bottom interconnection layer.

In a form, the material of the first electrode includes: cobalt or ruthenium.

In a form, the first electrode is selectively grown above the bottom interconnection layer using a chemical vapor deposition (CVD) process.

In a form, the CVD process includes: introducing reaction gas C7H5CoO2 with a gas flow from 10 sccm to 50 sccm in a reaction chamber, within a temperature range from 100° C. to 300° C., and within a pressure range from 0.1 Torr to 100 Torr.

In a form, the bottom electrode layer further includes: a second electrode above the first electrode.

In a form, the second electrode includes: titanium nitride, tantalum nitride, or tungsten nitride.

In a form, thickness of the second electrode is less than a thickness of the first electrode.

In a form, the thickness of the second electrode is 30 Å to 250 Å; and the thickness of the first electrode is 320 Å to 620 Å.

In a form, the thickness of the bottom electrode layer is 350 Å to 650 Å.

In a form, the step of forming a bottom electrode layer in the via includes: depositing, above the bottom interconnection layer, a first electrode that selectively grows on the bottom interconnection layer and fills a part of the via; forming a second electrode above the bottom dielectric layer and above the first electrode; and performing planarization on the second electrode to remove a part of the second electrode above the bottom dielectric layer.

In a form, the method further includes: forming a data storage layer above the bottom electrode layer; and forming a top electrode layer above the data storage layer.

In a form, the data storage layer includes: a switch layer above the bottom electrode layer and an glue layer above the switch layer; wherein the top electrode layer is formed above the glue layer.

In a form, the top electrode layer includes: a metal electrode layer above the data storage layer and a top protection layer above the metal electrode layer.

In a form, the metal electrode layer includes: aluminum; and the top protection layer includes: titanium nitride, tantalum nitride, or tungsten nitride.

In a form, the method further includes: forming a patterned hard mask layer above the top electrode layer; using the patterned hard mask layer as a mask to etch the top electrode layer and the data storage layer to form a patterned top electrode layer and a patterned data storage layer below the patterned hard mask layer; removing the patterned hard mask layer; forming a barrier layer to cover the patterned top electrode layer and the patterned data storage layer; and forming a top interconnection layer that penetrates the barrier layer and connects with the top electrode layer.

In the manufacturing method of the present disclosure, the bottom electrode layer includes a first electrode that is selectively grown, thus having a better via filling capability.

Further, the second electrode can prevent the first electrode from oxidation.

Further, the second electrode is not prone to peeling issues.

According to a second aspect of the present disclosure, a RRAM is provided, including: a bottom interconnection layer; a bottom electrode layer above the bottom interconnection layer, the bottom electrode layer including a first electrode selectively grown above the bottom interconnection layer; and a bottom dielectric layer surrounding the bottom electrode layer.

In a form, the first electrode includes: cobalt or ruthenium.

In a form, the bottom electrode layer further includes: a second electrode above the first electrode.

In a form, the second electrode includes: titanium nitride, tantalum nitride, or tungsten nitride.

In a form, thickness of the second electrode is less than a thickness of the first electrode.

In a form, a thickness of the second electrode is 30 Å to 250 Å; and the thickness of the first electrode is 320 Å to 620 Å.

In a form, the thickness of the bottom electrode layer is 350 Å to 650 Å.

In a form, the RRAM further includes: a data storage layer above the bottom electrode layer; and a top electrode layer above the data storage layer.

In a form, the data storage layer includes: a switch layer positioned above the bottom electrode layer and a glue layer positioned above the switch layer; wherein the top electrode layer is formed above the glue layer.

In a form, the top electrode layer includes: a metal electrode layer positioned above the data storage layer and a top protection layer positioned above the metal electrode layer.

In a form, the metal electrode layer includes: aluminum; and the top protection layer includes: titanium nitride, tantalum nitride, or tungsten nitride.

In a form, the RRAM further includes: a top interconnection layer positioned above the top electrode layer; and a barrier layer surrounding the top electrode layer, the data storage layer, and the top interconnection layer.

In the RRAM of the present disclosure, the bottom electrode layer includes a first electrode that selectively grows, thus having a better via filling capability.

Further, the second electrode can prevent the first electrode from oxidation.

Further, the second electrode is not prone to peeling issues.

Other features of the present disclosure and advantages thereof will become clear through the following detailed description made about exemplary forms of the present disclosure with reference to accompanying drawings.

BRIEF DESCRIPTION OF THE DRAWINGS

The accompanying drawings, which form a part of the specification, describe forms of the present disclosure, and are used for explain the principle of the present disclosure along with the specification.

The present disclosure may be understood more clearly according to the following detailed descriptions made with reference to the accompanying drawings, in which.

DETAILED DESCRIPTION

Various exemplary forms of the present disclosure will now be described in detail with reference to the accompanying drawings. It should be noted that, unless otherwise specifically indicated, relative arrangement of the components and the steps, numerical expressions and values stated in the forms do not limit the scope of the present disclosure.

At the same time, it should be understood that, for ease of description, sizes of various parts shown in the drawings are not drawn according to an actual proportional relation.

The following description about at least one exemplary form is merely explanatory, and is by no means any limitation to the scope of the present disclosure and applications or use thereof.

Technologies, methods and devices known to those of ordinary skill in the art may not be discussed in detail. But in suitable cases, these technologies, methods and devices should be regarded as a part of the description.

In all examples shown and discussed here, any specific value should be explained as merely exemplary instead of limiting. Therefore, other examples of the exemplary forms may have different values.

It should be noted that similar reference signs, labels, numerals, and letters indicate similar items in the following drawings. Therefore, once an item is defined in one drawing, it is not necessary to further discuss it in the subsequent drawings.

Figure 1:
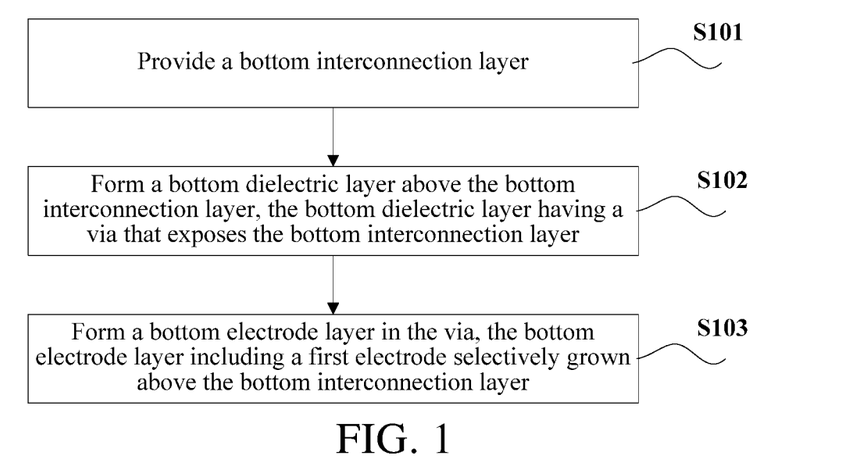
FIG. 1 is a flowchart of a manufacturing method of a RRAM.

FIG. 1 is a flowchart of a manufacturing method of a RRAM.

In step S101, a bottom interconnection layer is provided. As an example, the material of the bottom interconnection layer may include copper and the like.

In step S102. A bottom dielectric layer is formed above the bottom interconnection layer, the bottom dielectric layer having a via that exposes a portion of the bottom interconnection layer and provides connection access to the bottom interconnection layer. For example, the step S102 may include: forming a bottom dielectric layer above the bottom interconnection layer; and etching through the bottom dielectric layer to form a via that exposes the bottom interconnection layer.

In step S103. A bottom electrode layer is formed or deposited in the via, the bottom electrode layer including a first electrode that is selectively grown above the bottom interconnection layer. It should be noted that the term "selectively grown" here means that the first electrode is formed above the bottom interconnection layer, but is not formed above the bottom dielectric layer. For example, a conductive material matching lattice spacing or lattice constant of the material of the bottom interconnection layer may be selected as the first electrode. For example, in a situation where the bottom interconnection layer is copper, the material of the first electrode may include: Co or Ru or the like. In one implementation, the thickness of the first electrode may be 320 Å to 620 Å (such as 400 Å, 500 Å or 550 Å).

In a form, the first electrode may be selectively grown above the bottom interconnection layer by using a CVD process. This can ensure that the first electrode grows above the bottom interconnection layer, and thus can achieve a better filling of the via (i.e., gap filling capability).

By taking deposition of a Co film as an example, the CVD process may be carried out under the following condition: introducing reaction gas C7H5CoO2 (CyclopentadienylCobalt Dicarbonyl) with a gas flow from 10 sccm to 50 sccm (for example, the gas flow may be 20 sccm, 30 sccm, or 40 sccm) in a reaction chamber, within a temperature range from 100° C. to 300° C. (e.g., at a temperature of 200° C. or 250° C.), and within a pressure range from 0.1 Torr to 100 Torr (e.g., at a pressure of 10 Torr, 30 Torr or 70 Torr). The term "sccm" is a flow unit and stands for "standard cubic centimeters per minute". C7H5CoO2 has good wettability, and can thus help improve the gap filling capability of Co.

The Co film formed through the CVD process has a lower resistance, and can ensure a better filling property. The Co film formed through CVD has a higher growth selectivity on the bottom interconnection layer. Relative to the bottom dielectric layer around it, it is easier for the Co film to grow on a surface of the bottom interconnection layer (e.g., copper), leading to improved gap filling.

In the form above, depositing, above the bottom interconnection layer, the first electrode that selectively grows on the bottom interconnection layer can help improve the via filling capability of the bottom electrode layer.

In a form, the bottom electrode layer may further include: a second electrode above the first electrode. The second electrode may be used as an oxidation barrier layer to prevent the first electrode from oxidation. For example, the material of the second electrode may include: TiN, TaN or WN or the like. These materials are conductive electrically and thus can play the role of the second electron in addition to helping prevent the first electrode from oxidation. Preferably, the thickness of the second electrode is less than that of the first electrode. For example, the thickness of the second electrode may be 30 Å to 250 Å (e.g., 50 Å, 100 Å or 200 Å).

Because the via is filled with the first electrode, the thickness of the second electrode subsequently filled is thinner. As a result, peeling issues are less likely to occur. Reliability of the device may thus be improved.

In a form, the thickness of the bottom electrode layer (i.e., the sum of the thicknesses of the first electrode and the second electrode) may be 350 Å to 650 Å (e.g., 500 Å).

Optionally, the manufacturing method above may further include: forming a data storage layer above the bottom electrode layer. For example, the data storage layer may be formed above the second electrode. Optionally, the manufacturing method above may further include: forming a top electrode layer above the data storage layer. In a form, the data storage layer and the top electrode layer here may be patterned.

FIG. 2 to FIG. 14 are cross-sectional views schematically showing a RRAM structure during various manufacturing stage. The manufacturing process of a RRAM according to a form of the present disclosure is described below in detail with reference to FIG. 2 to FIG. 14.

Figure 2:
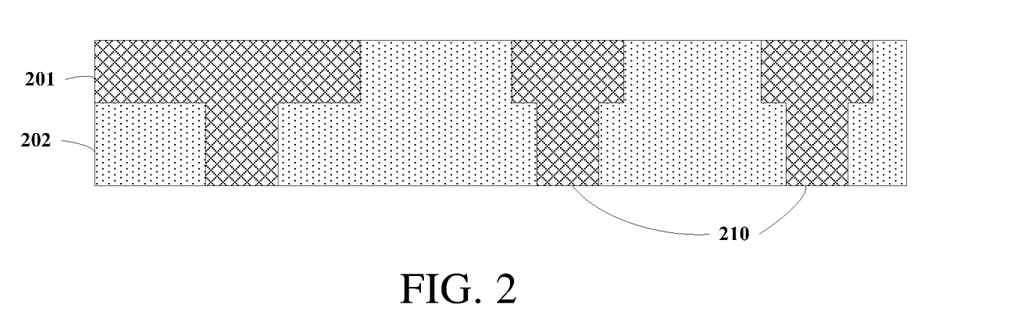
FIGS. 2-14 are cross-sectional views schematically showing a RRAM structure during various manufacturing stages.

Firstly, as shown in FIG. 2, a bottom interconnection layer 210 is provided. For example, the material of the bottom interconnection layer may be copper. In a form, the bottom interconnection layer 210 may be surrounded by a first dielectric layer 202. For example, the material of the first dielectric layer 202 may include silicon dioxide. As an example, FIG. 2 further illustrates a metal interconnection structure 201 of a logic unit part.

Figure 3:
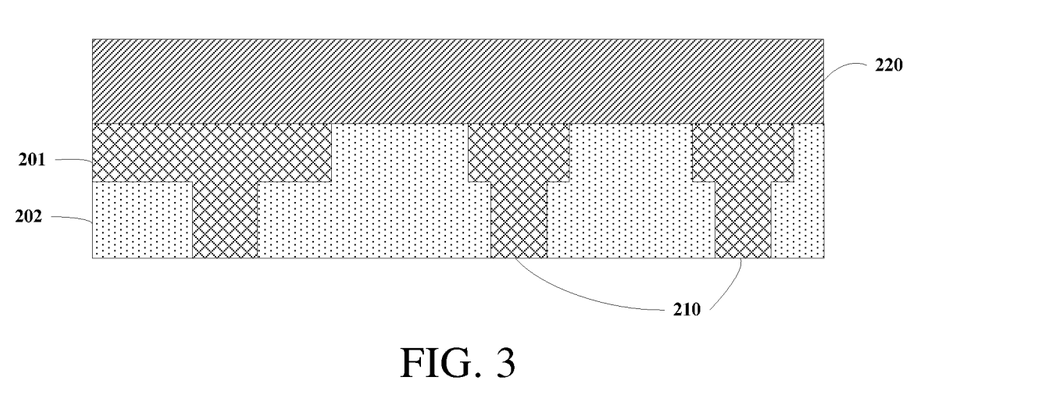

Next, as shown in FIG. 3, a bottom dielectric layer 220 is formed above the bottom interconnection layer 210 and the first dielectric layer 202.

In a form, the material of the bottom dielectric layer 220 may include: Nitrogen Doped SiC (NDC), silicon nitride and/or silicon dioxide. For example, the bottom dielectric layer 220 may include: a NDC layer above the bottom interconnection layer 210, a silicon nitride layer above the NDC layer, and a silicon dioxide layer above the silicon nitride layer. The thickness of the NDC layer, for example, may be 300 Å to 400 Å (e.g., 380 Å). The thickness of the silicon nitride layer, for example, may be 200 Å to 350 Å (e.g., 300 Å). The thickness of the silicon dioxide layer, for example, may be 30 Å to 100 Å (e.g., 50 Å).

Figure 4:
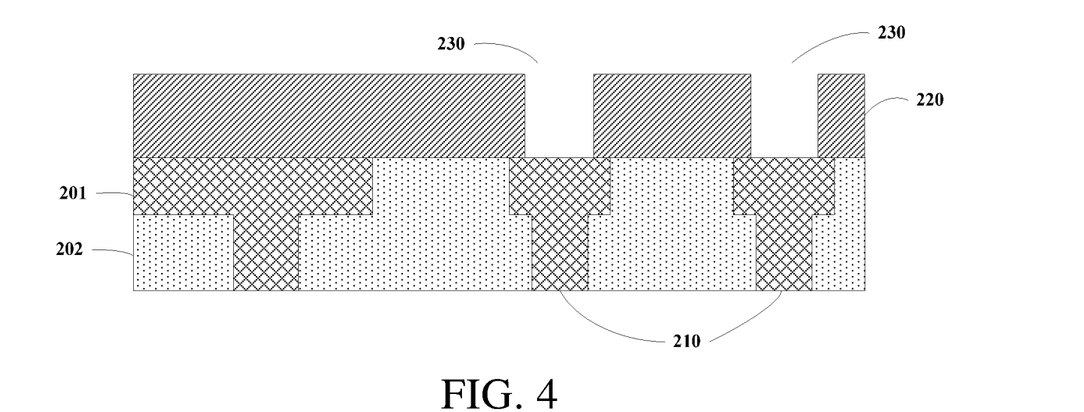

Next, as shown in FIG. 4, through, e.g., a lithographic and etching process, the bottom dielectric layer 220 is etched to form at least one via 230 that exposes a portion of the bottom interconnection layer 210.

Next, a bottom electrode layer is formed or deposited in the via 230. The process of forming the bottom electrode layer is described below in detail with reference to FIG. 5 to FIG. 7.

Figure 5:
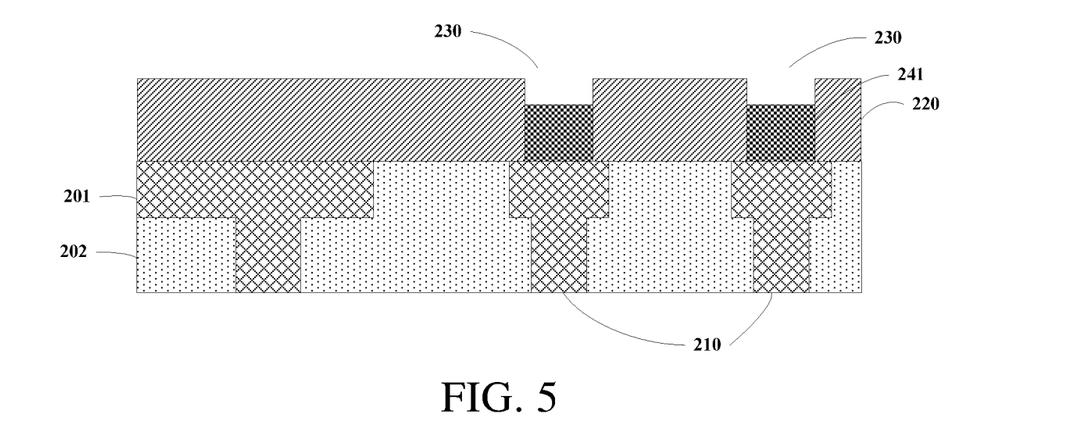

In one implementation, as shown in FIG. 5, a first electrode 241 that selectively grows and fills a part of the via 230 is formed above the bottom interconnection layer 210. For example, the first electrode 241 may be selectively grown above the bottom interconnection layer 210 by using a CVD process. As shown in FIG. 5, the first electrode 241 selectively grown is formed above the bottom interconnection layer 210, but is not formed above the bottom dielectric layer 220. As such, a better filling of the via can be achieved.

Figure 6:
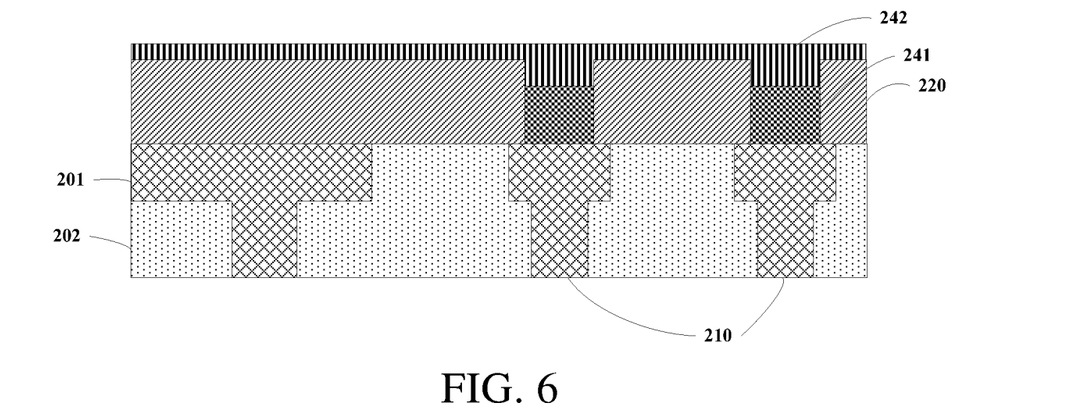

Next, as shown in FIG. 6 for an exemplary implementation, a second electrode 242 is formed above the bottom dielectric layer 220 and above the first electrode 241 through a PVD or Atomic Layer Deposition (ALD) process. The second electrode 242 fills the remaining part of the via 230.

Figure 7:
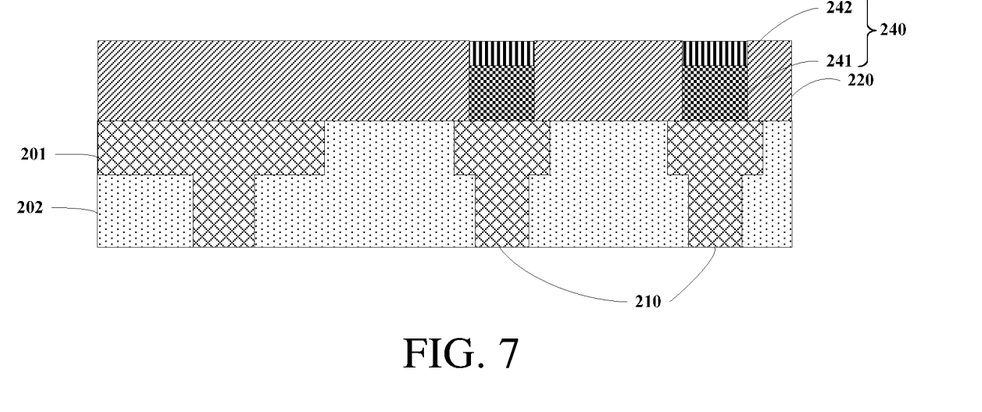

Next, as shown in FIG. 7, planarization (e.g., Chemical Mechanical Planarization (CMP) is carried out on the second electrode 242 to remove a part of the second electrode 242 above the bottom dielectric layer 220. That is, a part of the second electrode outside the via 230 is removed through a planarization process. As a result, the bottom electrode layer 240 in the via 230 is formed, and the bottom electrode layer 240 may include the first electrode 241 and the second electrode 242.

Figure 8:
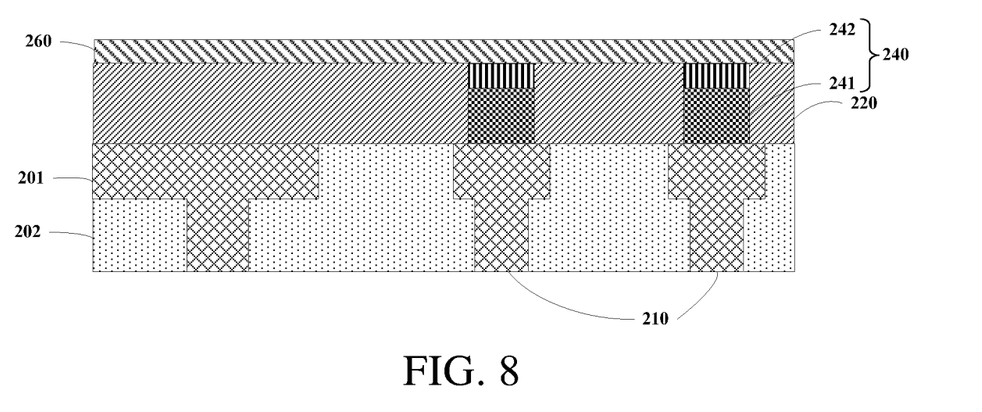

Next, as shown in FIG. 8, a data storage layer 260 is formed above the bottom electrode layer 240. In an implementation, as shown in FIG. 8, the data storage layer 260 is formed above the second electrode 242 and the bottom dielectric layer 220.

In a form, the data storage layer 260 may include: a switch layer (SL) above the bottom electrode layer 240 and a glue layer (GL) (not shown) above the SL. A top electrode layer (formed in a subsequent step) is formed above the GL. In another form, the SL and the GL may each be used as the data storage layer. As an example, the material of the SL may include a-Si (amorphous silicon), and the material of the GL may include silicon nitride.

Figure 9:
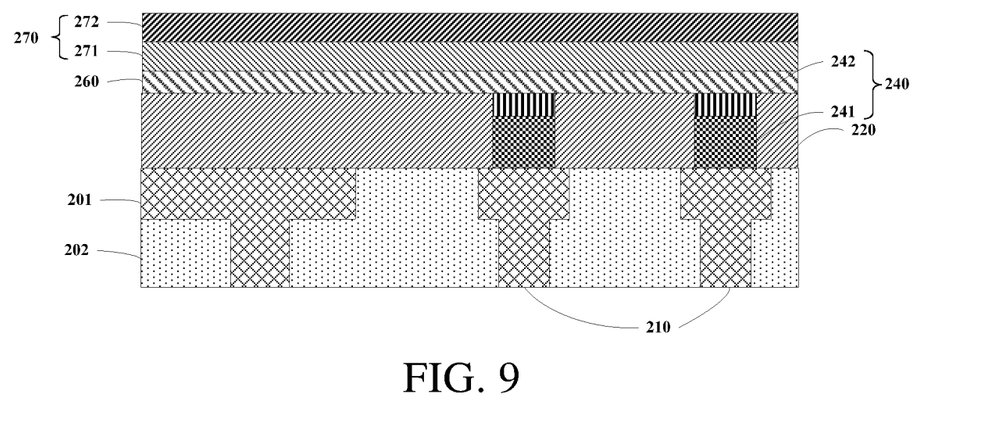

Next, as shown in FIG. 9, a top electrode layer 270 is formed above the data storage layer 260. In a form, as shown in FIG. 9, the top electrode layer 270 may include: a metal electrode layer 271 above the data storage layer 260 and a top protection layer 272 above the metal electrode layer 271. For example, the material of the metal electrode layer 271 may include: Al or the like. For example, the material of the top protection layer 272 may include: titanium nitride, tantalum nitride, or tungsten nitride or the like. The top protection layer may prevent the metal electrode layer from oxidation.

A manufacturing method of a RRAM according to various forms of the present disclosure has been provided above.

In the forms of the present disclosure, the manufacturing method of a RRAM above may further include the following steps.

Figure 10:
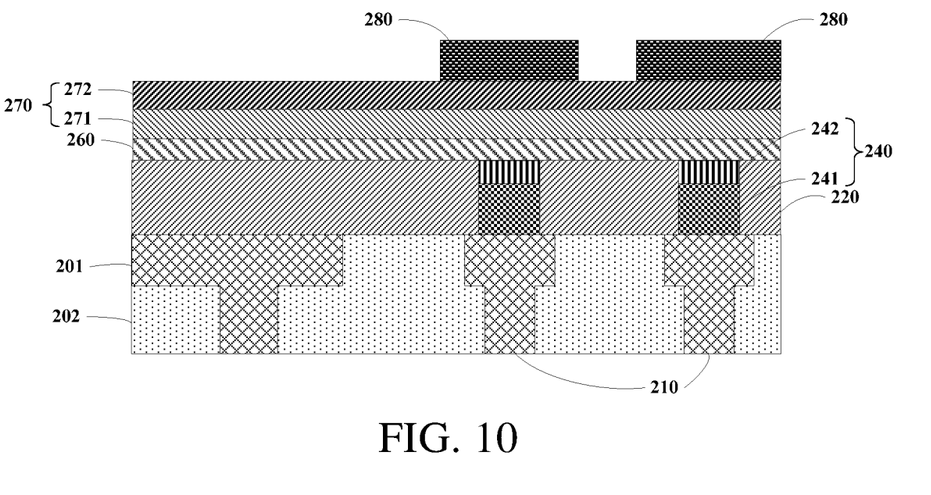

As shown in FIG. 10, a patterned hard mask layer 280 may be formed above the top electrode layer 270 (e.g., above the top protection layer 272 of the top electrode layer 270).

Figure 11:
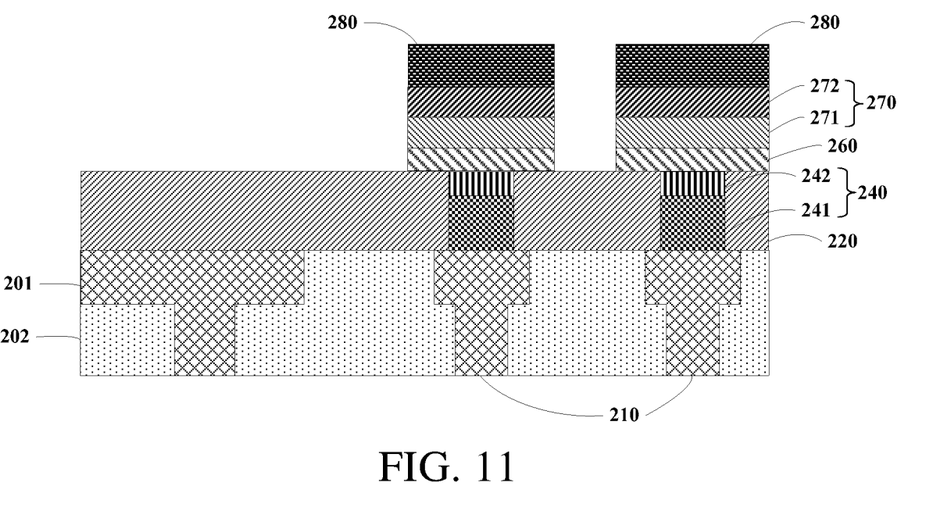

Next, as shown in FIG. 11, the patterned hard mask layer 280 is used as a mask to etch the top electrode layer 270 and the data storage layer 260 to form a patterned top electrode layer 270 and a patterned data storage layer 260.

Figure 12:
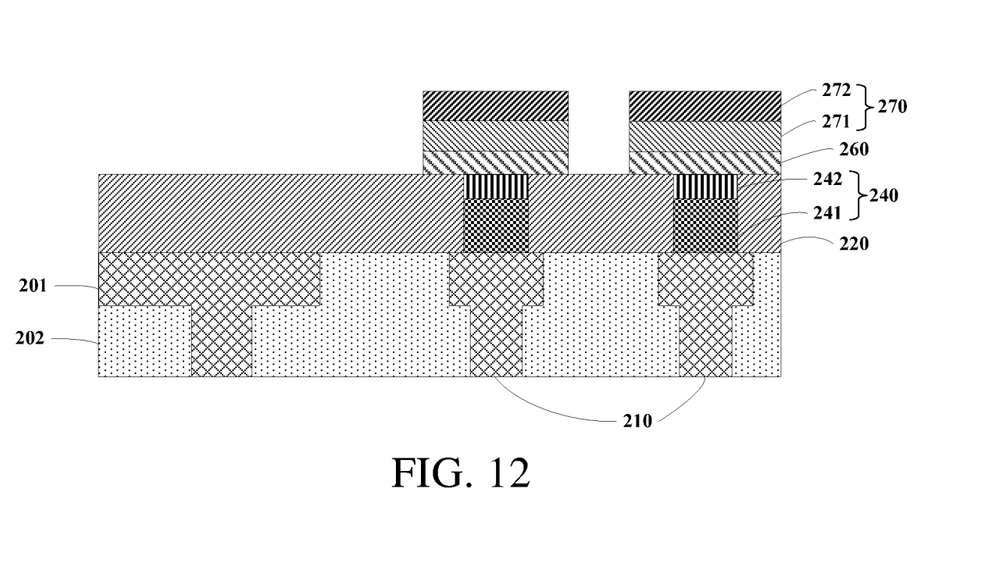

Next, as shown in FIG. 12, the hard mask layer 280 is removed.

Figure 13:
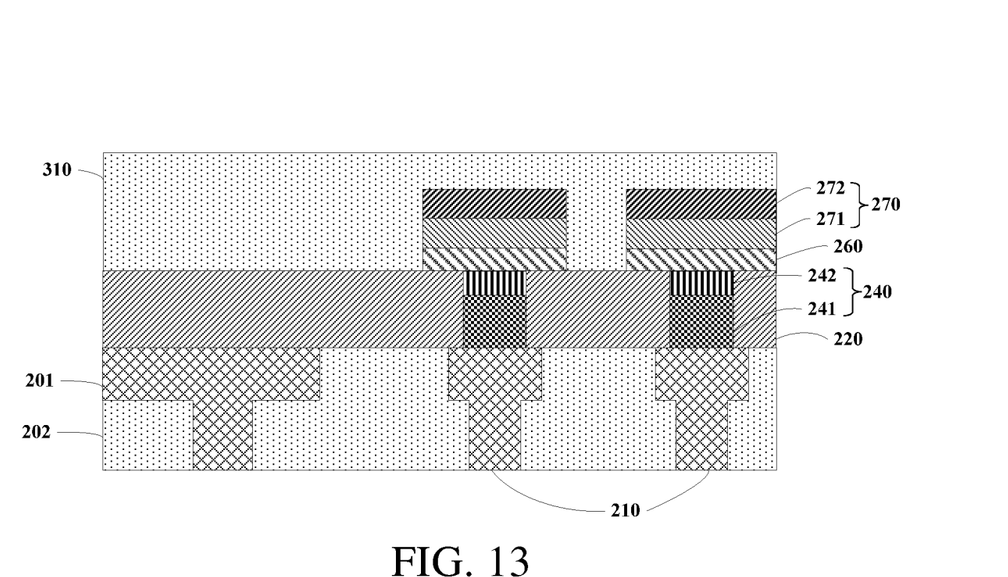

Next, as shown in FIG. 13, through, e.g., a deposition process, a barrier layer 310 is formed to cover the patterned top electrode layer 270 and the patterned data storage layer 260 from the top and the sides. For example, as shown in FIG. 13, the barrier layer is formed above and on two or more sides of the top electrode layer 270 and also formed on two or more sides of the data storage layer 260.

In a form, the barrier layer 310 may include: a NDC layer above and on sides of the top electrode layer 270 and on sides of the data storage layer 260, and a BD layer above the NDC layer. Here, the BD layer is a Black Diamond SiOCH, which is a low dielectric constant material. For example, the thickness of the NDC layer may be 100 Å to 200 Å (e.g., 150 Å), and the thickness of the BD layer may be 300 Å to 400 Å (e.g., 350 Å).

Figure 14:
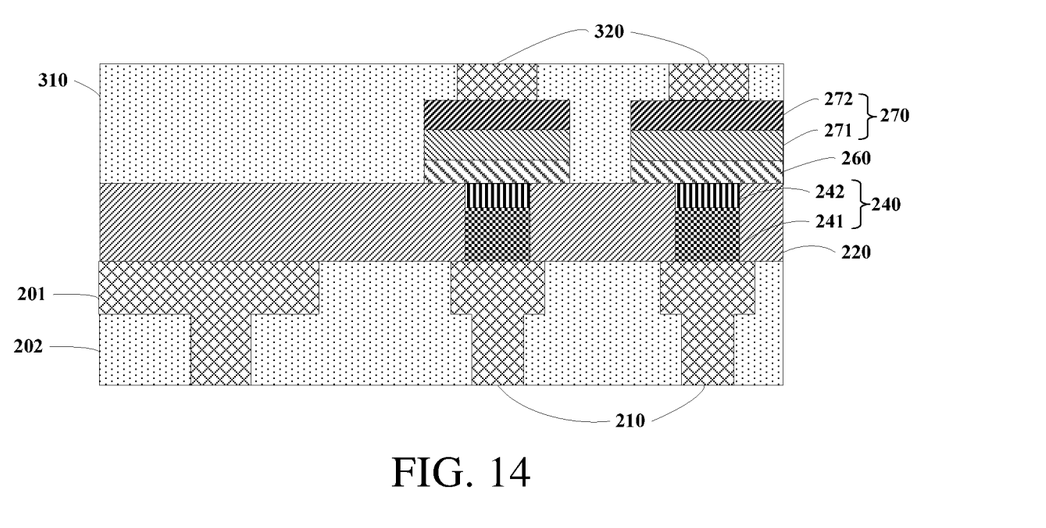

Next, as shown in FIG. 14, a top interconnection layer 320 that penetrates the barrier layer 310 and connects with the top electrode layer 270 is formed. As an example, the material of the top interconnection layer may include copper. In a form, the step of forming the top interconnection layer may include: etching the barrier layer 310 to form an opening that exposes an upper surface of the top electrode layer 270 (e.g., an upper surface of the top protection layer 272 of the top electrode layer 270); and then forming, in the opening, a top interconnection layer 320 in contact with the top electrode layer 270 (e.g., in contact with the top protection layer 272 of the top electrode layer 270).

The manufacturing method of RRAM above may be used to improve the via filling capability above the bottom electrode layer. The resulting electrodes are not prone to peeling. As such, reliability of the resulting device can be improved.

A RRAM may be formed with the manufacturing method described above. For example, as shown in FIG. 14, the RRAM may include a bottom interconnection layer 210. As an example, the material of the bottom interconnection layer 210 may include copper. The RRAM may further include a bottom electrode layer 240 above the bottom interconnection layer 210. The bottom electrode layer 240 may include a first electrode 241 selectively grown on the bottom interconnection layer 210. The material of the first electrode 241 may include, for example, Co or Ru or the like. The thickness of the first electrode may be 320 Å to 620 Å (such as 400 Å, 500 Å or 550 Å). The RRAM may further include a bottom dielectric layer 220 that surrounds the bottom electrode layer 240. In the RRAM above, the first electrode selectively grown has a relatively good gap filling capability with respect to filing the via.

In a form, as shown in FIG. 14, the bottom electrode layer 240 may further include: a second electrode 242 above the first electrode 241. The second electrode may prevent the first electrode from oxidation. For example, the material of the second electrode 242 may include: titanium nitride, tantalum nitride, or tungsten nitride or the like. Preferably, the thickness of the second electrode 242 is less than that of the first electrode 241. For example, the thickness of the second electrode 242 may be 30 Å to 250 Å (e.g., 50 Å, 100 Å or 200 Å). As the second electrode is thinner, peeling issues are unlikely to occur, and reliability of the device can be improved.

In a form, the thickness of the bottom electrode layer (i.e., the sum of the thicknesses of the first electrode and the second electrode) may be 350 Å to 650 Å (e.g., 500 Å).

In a form, as shown in FIG. 14, the RRAM may further include a data storage layer 260 above the bottom electrode layer 240. For example, the data storage layer 260 may be above the second electrode 242. In a form, as shown in FIG. 14, the RRAM may further include a top electrode layer 270 above the data storage layer 260.

In a form, the data storage layer 260 may include: a SL above the bottom electrode layer 240 and a GL (not shown) above the SL. The top electrode layer 270 is above the GL. In another form, the SL and the GL may each be used as the data storage layer.

In a form, as shown in FIG. 14, the top electrode layer 270 may include: a metal electrode layer 271 above the data storage layer 260 and a top protection layer 272 above the metal electrode layer 271. For example, the material of the metal electrode layer 271 may include Al or the like. For example, the material of the top protection layer 272 may include: titanium nitride, tantalum nitride, or tungsten nitride or the like. The top protection layer may prevent the metal electrode layer from oxidation.

In a form, as shown in FIG. 14, the RRAM may further include: a top interconnection layer 320 above the top electrode layer 270. The material of the top interconnection layer 320, for example, may include copper or the like.

In a form, as shown in FIG. 14, the RRAM may further include: a barrier layer 310 that surrounds the top electrode layer 270, the data storage layer 260, and the top interconnection layer 320.

The bottom electrode layer (including the first electrode 241 and the second electrode 242) of the RRAM of the present disclosure provides an improved capability for filing the via, and is not prone to peeling. As such, reliability of the device RRAM device above can be improved.

The present disclosure has described the process of manufacturing an RRAM structure and the resulting device in detail. In order to avoid obscuring the concept of the present disclosure, some well-known details in the field are omitted. Those of ordinary skill in the art should understand according to the above description how the technical solutions disclosed here are implemented.

Although some specific forms of the present disclosure have been described in detail through examples, those of ordinary skill in the art should understand that the examples above are merely illustrative and do not limit the scope of the present disclosure. Those of ordinary skill in the art should understand that the above forms can be modified without departing from the scope and spirit of the present disclosure defined by the appended claims.

What is claimed is:

1. A method for manufacturing a resistive random access memory (RRAM), comprising:
    providing a metal bottom interconnection layer;
    forming a bottom dielectric layer above the metal bottom interconnection layer, the bottom dielectric layer comprising a via through the bottom dielectric layer that exposes a portion of the metal bottom interconnection layer; and
    forming a bottom electrode layer in the via, the bottom electrode layer comprising a first electrode being only formed above the metal bottom interconnection layer, wherein the first electrode is selectively grown above the metal bottom interconnection layer using a chemical vapor deposition (CVD) process.

2. The method according to claim 1, wherein the CVD process comprises:
    introducing reaction gas $C_7H_5CoO_2$ with a gas flow from 10 sccm to 50 sccm in a reaction chamber, within a temperature range from 100° C. to 300° C., and within a pressure range from 0.1 Torr to 100 Torr.

3. The method according to claim 1, wherein the bottom electrode layer further comprises a second electrode above the first electrode.

4. The method according to claim 3, wherein a thickness of the second electrode is less than a thickness of the first electrode.

5. The method according to claim 3, wherein forming the bottom electrode layer in the via comprises:
   depositing, above the metal bottom interconnection layer, a first electrode that selectively grows on the metal bottom interconnection layer and fills a part of the via;
   forming a second electrode above the bottom dielectric layer and above the first electrode; and
   performing planarization on the second electrode to remove a part of the second electrode above the bottom dielectric layer.

6. The method according to claim 1, further comprising:
   forming a data storage layer above the bottom electrode layer; and
   forming a top electrode layer above the data storage layer.

7. The method according to claim 6, wherein the data storage layer comprises a switch layer above the bottom electrode layer and a glue layer above the switch layer, wherein the top electrode layer is formed above the glue layer.

8. The method according to claim 6, wherein the top electrode layer comprises a metal electrode layer above the data storage layer and a top protection layer above the metal electrode layer.

9. The method according to claim 6, further comprising:
   forming a patterned hard mask layer above the top electrode layer;
   using the patterned hard mask layer as a mask to etch the top electrode layer and the data storage layer to form a patterned top electrode layer and a patterned data storage layer below the patterned hard mask layer;
   removing the patterned hard mask layer;
   forming a barrier layer to cover the patterned top electrode layer and the patterned data storage layer; and
   forming a top interconnection layer that penetrates the barrier layer and connects with the top electrode layer.

* * * * *